(12) United States Patent
Liaw

(10) Patent No.: US 8,947,902 B2
(45) Date of Patent: Feb. 3, 2015

(54) SEMICONDUCTOR MEMORY AND METHOD OF MAKING THE SAME

(75) Inventor: Jhon Jhy Liaw, Zhudong Township, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 276 days.

(21) Appl. No.: 13/412,804

(22) Filed: Mar. 6, 2012

(65) Prior Publication Data
US 2013/0235640 A1 Sep. 12, 2013

(51) Int. Cl.
*G11C 5/06* (2006.01)

(52) U.S. Cl.
USPC .................................................. 365/63

(58) Field of Classification Search
CPC ........................................................ G11C 5/06
USPC ............................................. 365/63, 230.03
See application file for complete search history.

(56) References Cited

U.S. PATENT DOCUMENTS

| | | |
|---|---|---|
| 4,569,122 A | 2/1986 | Chan |
| 5,010,032 A | 4/1991 | Tang et al. |
| 5,111,428 A | 5/1992 | Liang et al. |
| 5,128,744 A | 7/1992 | Asano et al. |
| 5,187,114 A | 2/1993 | Chan et al. |
| 5,204,279 A | 4/1993 | Chan et al. |
| 5,298,782 A | 3/1994 | Sundaresan |
| 5,330,929 A | 7/1994 | Pfiester et al. |
| 5,336,916 A | 8/1994 | Chan et al. |
| 5,394,358 A | 2/1995 | Huang |
| 5,467,305 A | 11/1995 | Bertin et al. |
| 5,536,683 A | 7/1996 | Lin et al. |
| 5,710,448 A | 1/1998 | Krautschneider et al. |
| 5,795,800 A | 8/1998 | Chan et al. |
| 5,827,764 A | 10/1998 | Liaw et al. |
| 5,831,315 A | 11/1998 | Kengeri et al. |
| 5,831,899 A | 11/1998 | Wang et al. |
| 5,843,816 A | 12/1998 | Liaw et al. |
| 5,866,449 A | 2/1999 | Liaw et al. |
| 5,867,434 A | 2/1999 | Oh et al. |
| 5,930,633 A | 7/1999 | Liaw |
| 5,955,768 A | 9/1999 | Liaw et al. |
| 5,970,375 A | 10/1999 | Gardner et al. |
| 5,998,249 A | 12/1999 | Liaw et al. |
| 6,013,547 A | 1/2000 | Liaw |
| 6,091,630 A | 7/2000 | Chan et al. |
| 6,194,313 B1 | 2/2001 | Singh et al. |
| 6,239,458 B1 | 5/2001 | Liaw et al. |
| 6,271,570 B1 | 8/2001 | Huang et al. |
| 6,285,088 B1 | 9/2001 | Madan |
| 6,329,720 B1 | 12/2001 | Li et al. |
| 6,399,495 B1 | 6/2002 | Tseng et al. |
| 6,436,744 B1 | 8/2002 | Bryant et al. |
| 6,441,448 B1 | 8/2002 | Maeda et al. |
| 6,455,884 B1 | 9/2002 | Chan et al. |

(Continued)

OTHER PUBLICATIONS

Radens, C.J. et al., "An Orthogonal 6F2 Trench Sidewall Vertical Device Cell for 4Gb/16Gb DRAM". IEDM Technical Digest, International Electron Devices Meeting, Dec. 2000, pp. 15.1.1-15.1.4.

*Primary Examiner* — Anthan Tran
(74) *Attorney, Agent, or Firm* — Duane Morris LLP

(57) ABSTRACT

A semiconductor memory includes a first bit cell within an integrated circuit (IC), and a second bit cell within the same IC. The first bit cell has a first layout, and the second bit cell has a second layout that differs from the first layout.

20 Claims, 20 Drawing Sheets

(56) References Cited

U.S. PATENT DOCUMENTS

| | | |
|---|---|---|
| 6,486,056 B2 | 11/2002 | Pasch et al. |
| 6,512,299 B1 | 1/2003 | Noda |
| 6,635,937 B2 | 10/2003 | Ootsuka et al. |
| 6,661,043 B1 | 12/2003 | Huang et al. |
| 6,677,649 B2 | 1/2004 | Osada et al. |
| 6,677,650 B2 | 1/2004 | Fischer et al. |
| 6,699,726 B2 | 3/2004 | Hidaka et al. |
| 6,724,085 B2 | 4/2004 | Tomita |
| 6,731,534 B1 | 5/2004 | Fan |
| 6,744,106 B2 | 6/2004 | Kanai |
| 7,006,370 B1 | 2/2006 | Ramesh et al. |
| 7,176,125 B2 | 2/2007 | Liaw |
| 7,187,036 B2 | 3/2007 | Liaw |
| 7,394,155 B2 | 7/2008 | Liaw |
| 7,514,757 B2 | 4/2009 | Liaw |
| 7,812,407 B2 | 10/2010 | Liaw |
| 2002/0027810 A1 | 3/2002 | Iida et al. |
| 2002/0090812 A1 | 7/2002 | Chang |
| 2003/0122160 A1 | 7/2003 | Houston et al. |
| 2003/0153136 A1 | 8/2003 | Matsumoto et al. |
| 2004/0062101 A1 | 4/2004 | Kasuga |
| 2004/0185609 A1 | 9/2004 | Okumura et al. |
| 2004/0196705 A1 | 10/2004 | Ishikura et al. |
| 2004/0232497 A1 | 11/2004 | Akiyama et al. |
| 2004/0238863 A1 | 12/2004 | Liu et al. |
| 2004/0256732 A1 | 12/2004 | Liaw |
| 2006/0076600 A1 | 4/2006 | Nakabayashi et al. |
| 2006/0146586 A1* | 7/2006 | Hirabayashi ............ 365/51 |
| 2006/0202361 A1 | 9/2006 | Liaw |
| 2007/0076491 A1 | 4/2007 | Cherukuri |
| 2007/0080387 A1 | 4/2007 | Liu et al. |
| 2007/0235765 A1 | 10/2007 | Liaw |
| 2008/0028351 A1* | 1/2008 | Chou et al. ............ 716/10 |
| 2011/0147909 A1* | 6/2011 | Hsuan et al. ............ 257/686 |

* cited by examiner

SEMICONDUCTOR MEMORY AND METHOD OF MAKING THE SAME

FIELD OF DISCLOSURE

The disclosed circuits and methods relate to integrated circuits ("ICs"). More specifically, the disclosed circuits and methods relate to IC memory devices.

BACKGROUND

Static random access memories ("SRAM") include a plurality of cells disposed in rows and columns to form an array. SRAM cells include a plurality of transistors coupled to bit lines and word lines that are used to read and write a bit of data to the memory cell. Single-port memories enable a single bit of data to be written to or read from a bit cell at a particular time. Two-port memories specific types memories that enable multiple reads or writes to occur at approximately the same time.

The stability of a semiconductor memory, such as an SRAM, is impacted as devices are continually scaled down. Consequently, multiple lithography and etch steps are becoming popular to ensure metal routing and island printing as processing technology moves to 22 nm and beyond. However, even as multiple step lithography and etch processes are used, reduced island sizes and spacers that are compatible with the lithography steps will become more important in future designs.

DETAILED DESCRIPTION

This description of the exemplary embodiments is intended to be read in connection with the accompanying drawings, which are to be considered part of the entire written description.

The disclosed semiconductor layouts include two different metal routing schemes that may be implemented on a single chip, which enable the optimization of cell structures for high-density and/or high-current applications. In some embodiments, the two or more cell layouts are of differing sizes and provide for litho-friendly routing.

Figure 1:
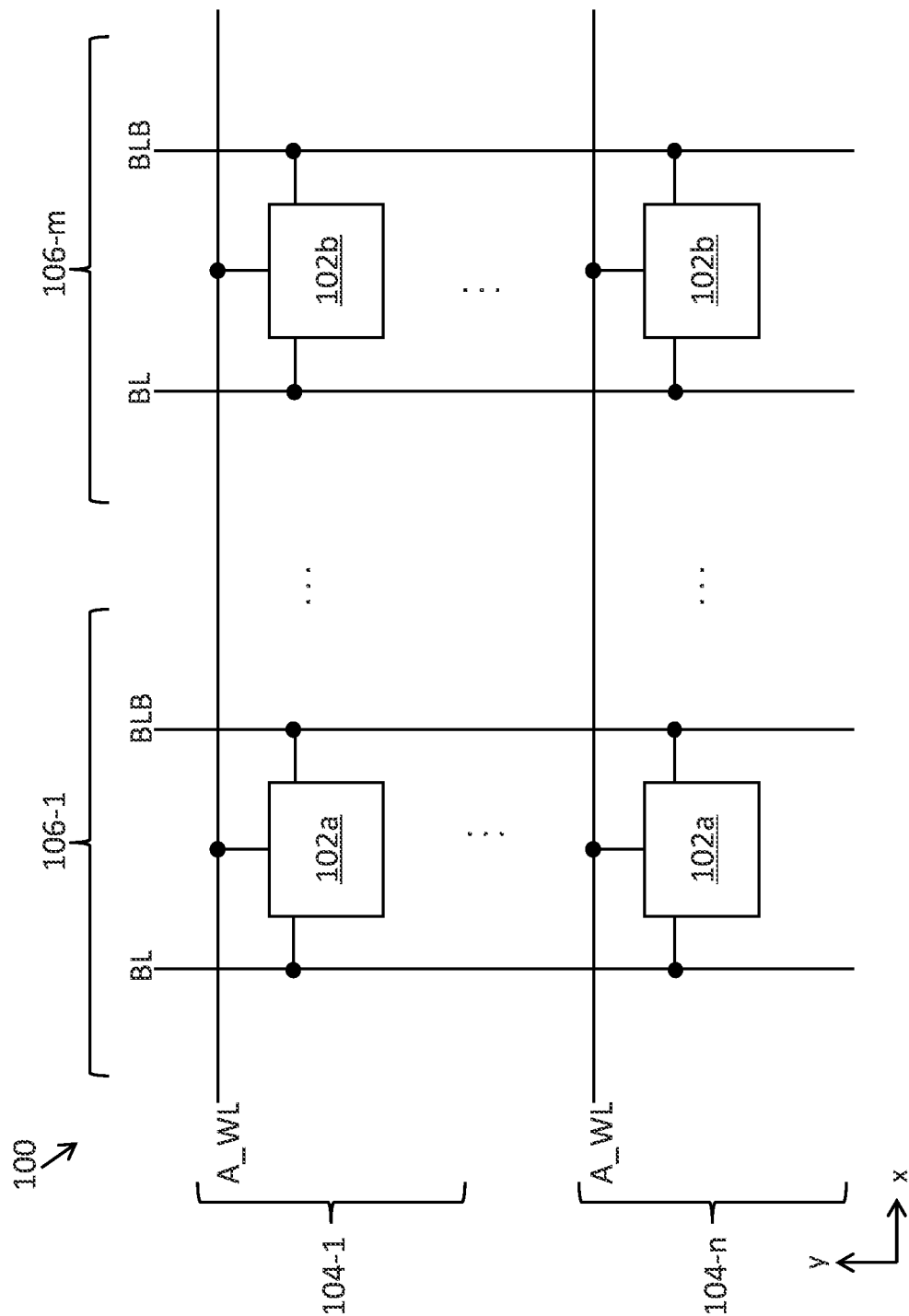
FIG. 1 illustrates one example of a semiconductor memory comprising a plurality of single-port bit cells arranged in rows and columns.

FIG. 1 illustrates one example of a single-port static random access memory ("SRAM") array 100 including a plurality of single-port bit cells 102a, 102b (collectively referred to as "bit cells 102"). Bit cells 102 are arranged in a number, n, of rows 104 and a number, m, of columns 106. Each bit cell 102a, 102b is coupled to a word line, WL, that extends horizontally across the memory array (i.e., in an x-direction) and two complementary bit lines ("BL"), BL and its complement, BLB, that extend vertically across the memory array (i.e., in a y-direction). As described in detail below, the layouts of bit cells 102a, 102b may differ such that semiconductor memory array 100 may be optimized for high-density applications, e.g., bit cells 102a, or for high-current applications, e.g., bit cells 102b.

Figure 2:
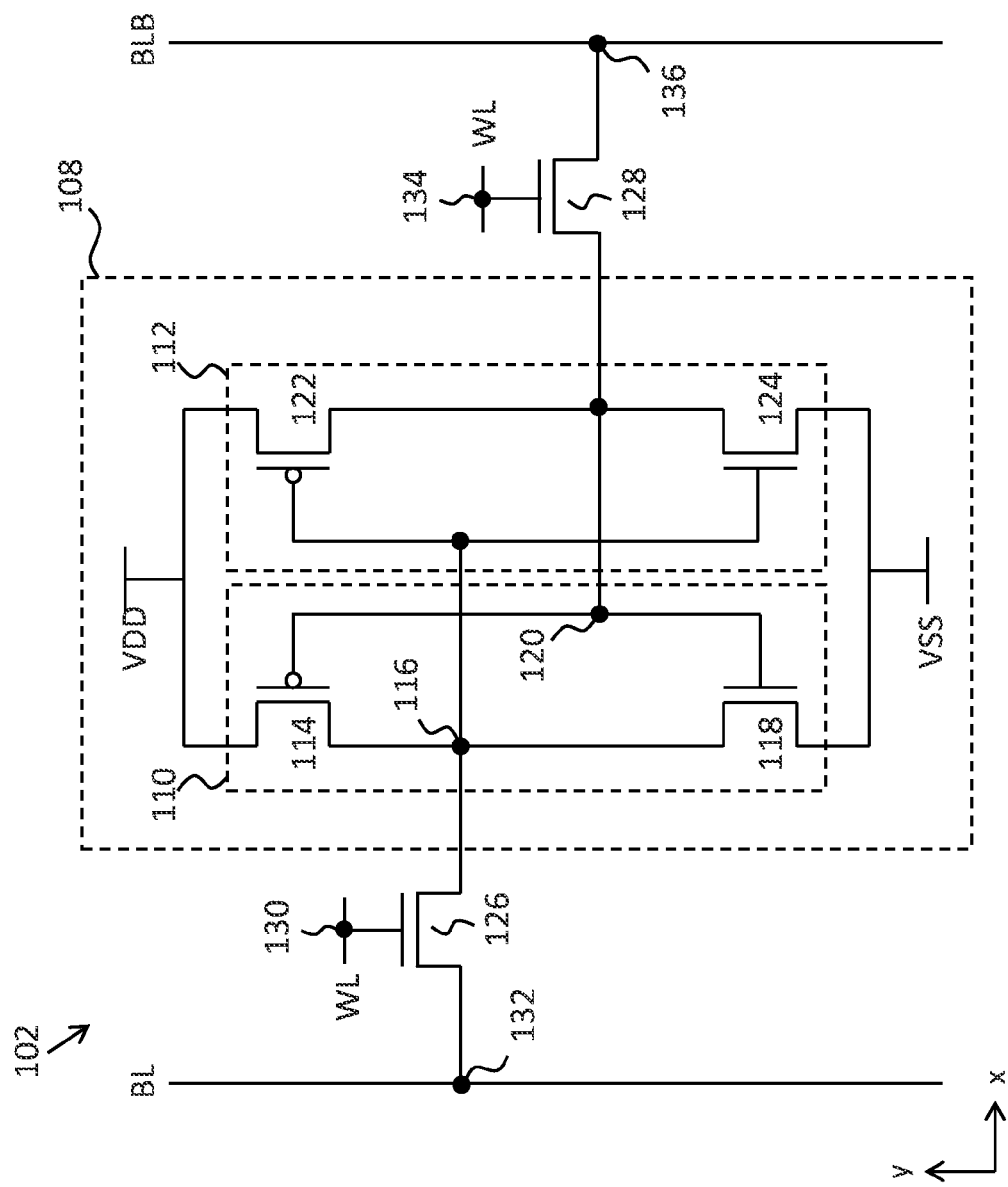
FIG. 2 illustrates one example of a single-port memory bit cell that may be implemented in the semiconductor memory of FIG. 1.

As best seen in FIG. 2, which is one example of a single-port six-transistor ("6T") bit cell 102, each bit cell 102 includes a latch 108 formed by a pair of cross coupled inverters 110, 112. Inverter 110 includes a PMOS transistor 114 having its source coupled to high-voltage source, VDD, and its drain coupled to node 116, which serves as the output of inverter 110. NMOS transistor 118 of inverter 110 has its source coupled to low-voltage source VSS and its drain coupled to node 116. The gates of transistors 114 and 118 are coupled together at node 120, which serves as the input of inverter 110 and the output of inverter 112. Inverter 112 includes a PMOS transistor 122 having is source coupled to VDD, its gate coupled to node 116, and its drain coupled to node 120. NMOS transistor 124 of inverter 112 has its source coupled to VSS, its drain coupled to node 120, and its gate coupled to node 116.

Bit cell 102 also includes a pair of pass transistors 126, 128. In some embodiments, transistors 126, 128 are NMOS transistors, although one skilled in the art will understand that transistors 126, 128 may be implemented as PMOS transistors. Transistor 126 has its gate coupled to word line WL at node 130, its source coupled to node 116, and its drain coupled to bit line BL at node 132. Transistor 128 has its gate coupled to word line WL at node 134, its source coupled to node 116, and its drain coupled to bit line BLB at node 136.

The transistors of bit cell 102 may be formed in one or more active regions of a semiconductor substrate using various technologies. For example, the transistors of the bit cell may be formed as bulk planar metal oxide field effect transistors ("MOSFETs"), bulk finFETs having one or more fins or fingers, semiconductor on insulator ("SOI") planar MOS- FETs, SOI finFETs having one or more fins or fingers, or combinations thereof. The gates of the devices may include a polysilicon ("poly")/silicon oxynitride ("SiON") structure, a high-k/metal gate structure, or combinations thereof. Examples of the semiconductor substrate include, but are not limited to, bulk silicon, silicon-phosphorus ("SiP"), silicon-germanium ("SiGe"), silicon-carbide ("SiC"), germanium ("Ge"), silicon-on-insulator silicon ("SOI-Si"), silicon-on-insulator germanium ("SOI-Ge"), or combinations thereof.

Figure 3:
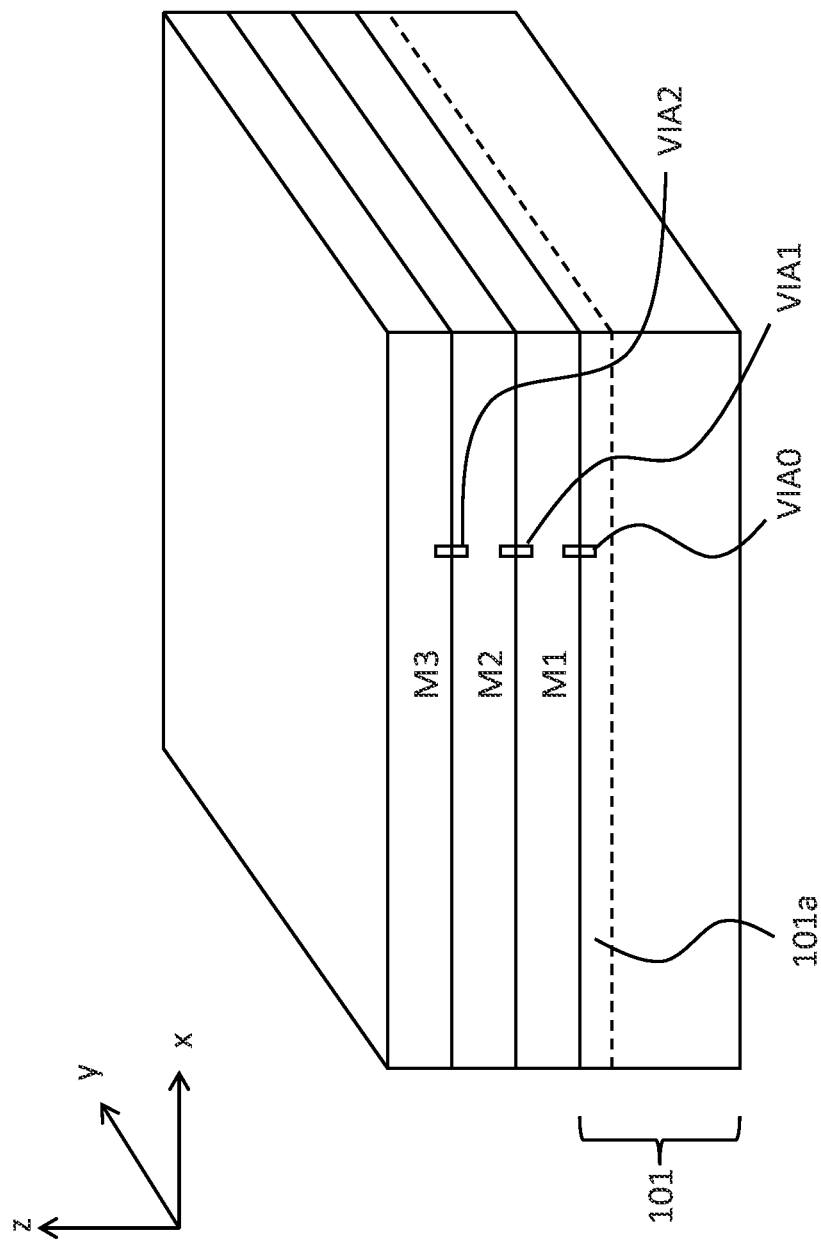
FIG. 3 is an isometric view of one example of a semiconductor substrate over which a plurality of conductive layers are formed to provide a semiconductor memory in accordance with FIGS. 1 and 2.

FIG. 3 is an isometric view of a semiconductor substrate 101 having one or more doped active regions 101a. For example, one or more n-wells and/or p-wells may be formed in doped regions 101a. A plurality of conductive layers, M1-M3 are formed above substrate 101 in a vertical or z-direction. Each conductive layer M1-M3 defines a plane in the x- and y-direction and may be separated from each other and from substrate 101 by one or more dielectric layers (not shown). As will be understood by one skilled in the art, vias extend in the vertical direction, i.e., z-direction, to provide interconnects between conductive layers M1-M3 and semiconductor substrate 101. Fewer or more than three conductive layers may be formed over semiconductor substrate 101.

Figure 4:
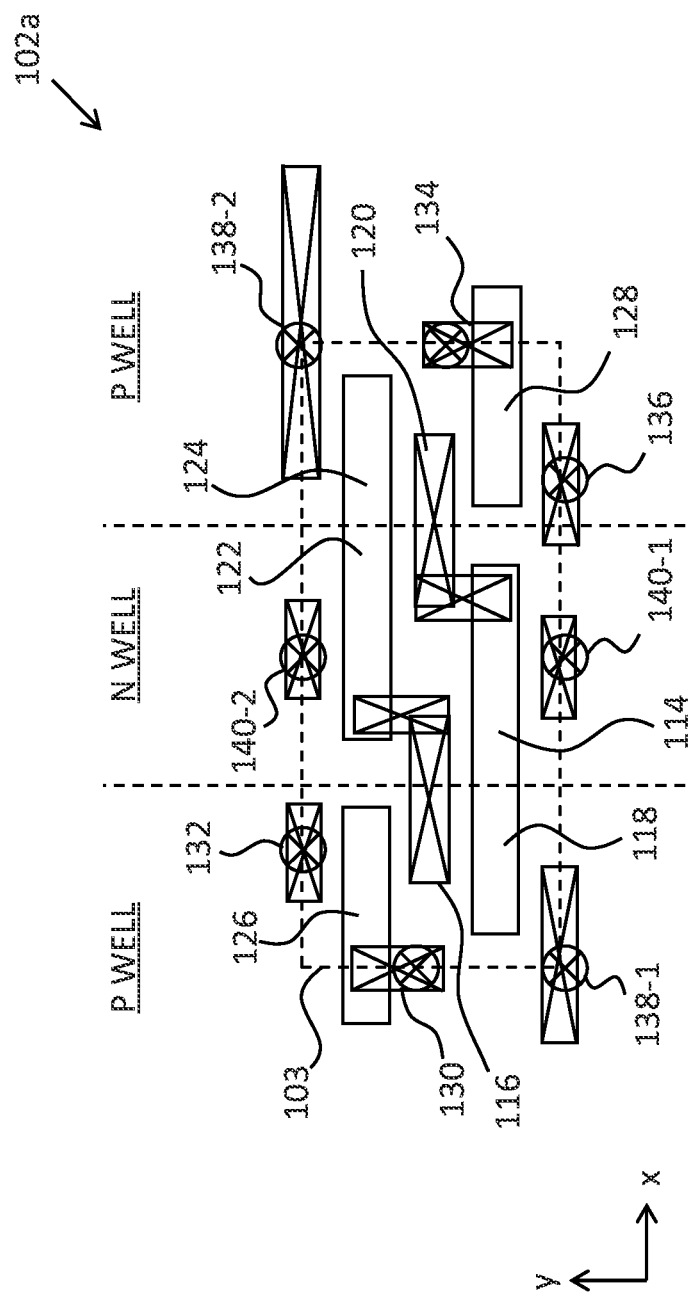
FIG. 4 illustrates one example of a FEOL layout of a single-port semiconductor bit cell configured for high-density applications.

FIG. 4 illustrates one example of a front end of line ("FEOL") layout, e.g., the layout of doped regions 101a of substrate 101, of a bit cell 102 in accordance with the semiconductor memory array 100 illustrated in FIG. 1. As shown in FIG. 4, bit cell 102a includes a cell boundary 103 having a length that extends in the x-direction that is greater than a width, which extends in the y-direction. Bit cell 102a includes a pair of p-wells that are separated by a n-well. Pull-down transistor 118 and pass transistor 126 are formed in one p-well, and pull down transistor 124 and pass transistor 128 are formed in the other p-well. Pull-up transistors 114 and 122 are formed in the n-well.

A first via layer, e.g., VIA0, is used connect devices formed in doped regions 101a of semiconductor substrate 101 to conductive routing lines form in conductive layers, e.g., layers M1-M3, which are formed during back end of line ("BEOL") processing. For example, node 130, which couples the gate of pass transistor 130 to the WL, is formed in VIA0 as is node 132, which couples pass transistor 126 to bit line BL. Node 134, which couples pass gate transistor 128 to the WL is formed in VIA0 as is node 136, which couples pass transistor 128 to bit line BLB. VIA0 also includes nodes 138-1 and 138-2, which respectively couple pull down transistors 118 and 124 to VSS, and nodes 140-1 and 140-2, which respectively couple pull down transistor 114 and 124 to VDD.

Vias 130 and 138-1 are arranged such that they are aligned in the y-direction along a leftmost portion of cell boundary 103. Vias 134 and 138-2 are aligned with one another in the y-direction and are disposed on the rightmost edge of cell boundary 103. Vias 132, 138-2, and 140-2 are aligned with each other in the x-direction and are disposed along a topmost boundary of cell boundary 103. Vias 138-1, 136, and 140-1 are aligned with one another in the x-direction and are disposed along the bottommost edge of cell boundary 103.

Figure 5A:
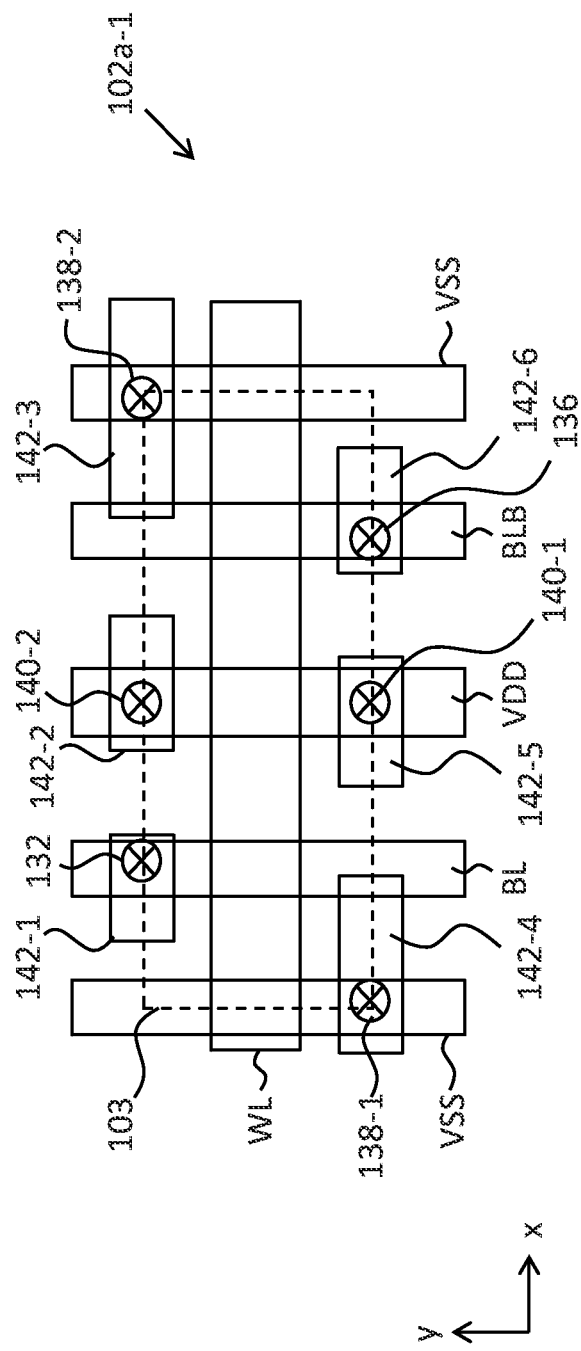
FIGS. 5A-5C illustrate various embodiments of BEOL layouts of the single-port memory bit cell illustrated in FIG. 4.

The layout first and second metal layers, e.g., M1 and M2 of a high-density transistor 102a-1 is illustrated in FIG. 5A. In some embodiments, the length-to-width ratio of a high-density bit cell 102a is greater than or equal to two. As shown in FIG. 5A, the WL horizontally extends across bit cell 102a and may be formed in a first conductive layer, M1. Islands 142-1, 142-2, 142-3, 142-4, 142-5, and 142-6 ("islands 142") are also formed in the first conductive layer, M1, and are disposed in a parallel relation to the WL. Islands 142 serve as landing pads for vias that connect different conductive layers. For example, islands or landing pads 142 formed in the first conductive layer M1 are coupled to VIA0, which is disposed between doped region 101a of semiconductor substrate 101 and the first conductive layer M1, and to VIA1, which extends in the z-direction between the first conductive layer, M1, and the second conductive layer, M2. In some embodiments, the word line WL and islands or landing pads 142 may have a line shape layout in which the length of the lines is greater than a width of the lines by at least 1.8. Locating the WL in the first conductive layer, M1, enables additional landing pads 142 to be disposed in the same conductive layer.

The lines in the second conductive layer, M2, extend in the y-direction such that they are disposed perpendicular to the WL and islands 142 that are disposed in the first conductive layer, M1. In particular, the second conductive layer, M2, includes a pair of lines that are coupled to the low voltage power supply, VSS, and a line that is coupled to the high voltage power supply, VDD. The low power supply lines may be disposed at the boundary 103 of the bit cell 102a. Bit line BL is also formed in the second conductive layer and is disposed between one of the low voltage power supply lines and the high voltage power supply line. Bit line BLB is formed in the second conductive layer and is disposed between the high voltage power supply line and the other low voltage power supply line such that the high voltage power supply line separates bit lines BL and BLB.

Figure 5B:
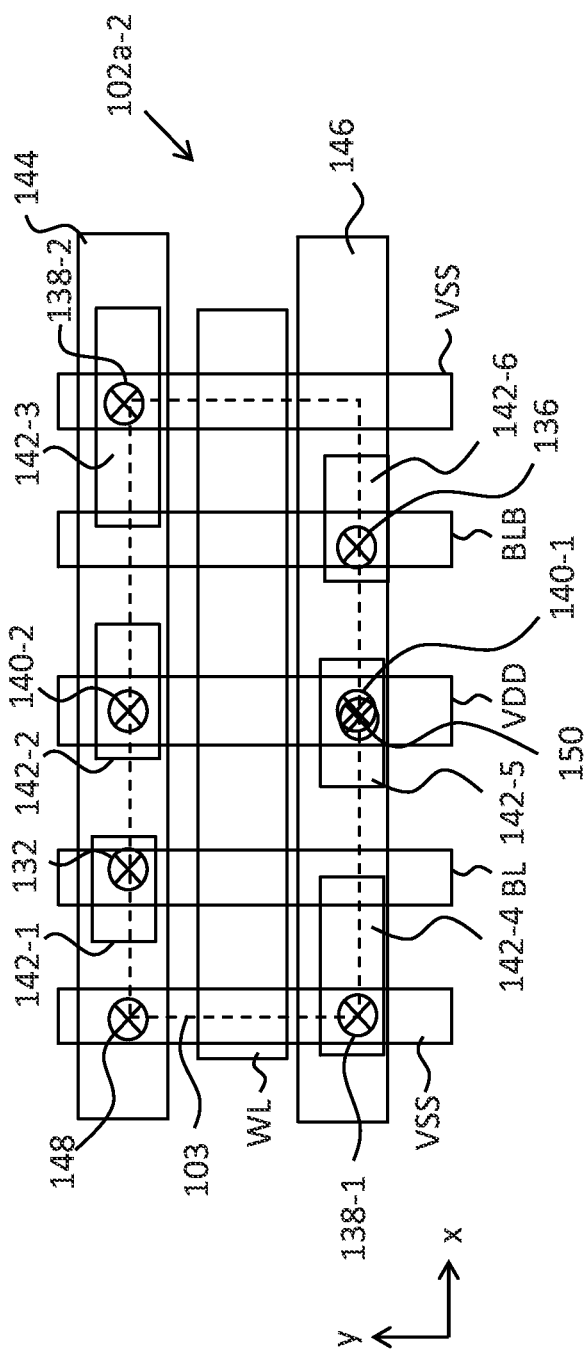

In some embodiments, such as the embodiment of a high-density bit cell 102a-2 illustrated in FIG. 5B, a third conductive layer, M3, may include lines for coupling together the pair of VSS lines and for further routing of the power lines. In FIG. 4B, the third conductive layer, M3, includes a line 144 that extends in the x-direction and couples together VSS lines disposed in the second conductive layer, M2, by via 148, which is disposed in VIA2 between the second and third conductive layers. Line 146 is also disposed in the third conductive layer M3 and is coupled to the VSS line in the second conductive layer M2 by a via 150, which is also disposed in VIA2.

Figure 5C:
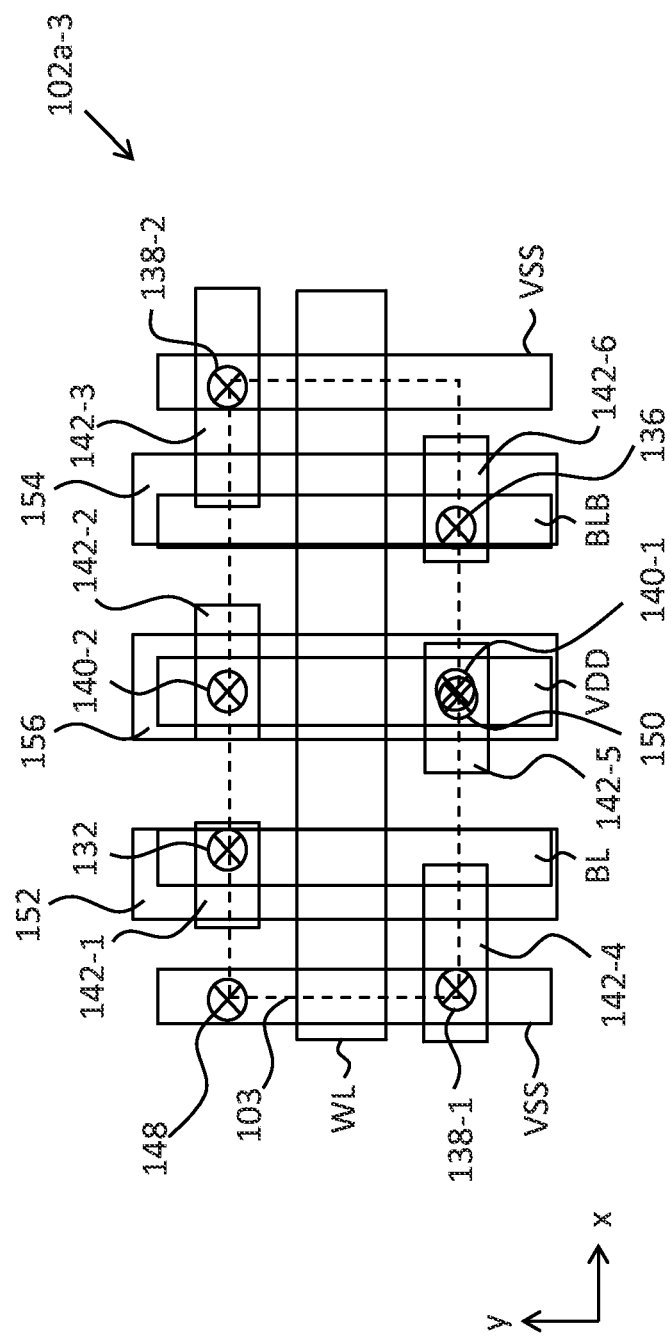

In some embodiments, such as the embodiment illustrated in FIG. 5C, the third conductive layer, M3, includes first and second lines 152, 154, which may be coupled to low voltage power supply VSS, and a line 156 that is coupled to high voltage power supply line VDD. As shown in FIG. 5C, line 152 is disposed over and at least partially covers bit line BL, and line 154 is disposed over and at least partially covers bit line BLB. Line 156 is disposed over and at least partially covers the high voltage power supply line VDD disposed in the second conductive layer, M2, and may be coupled to the supply line VDD by via 150, which is disposed in VIA2.

Figure 6:
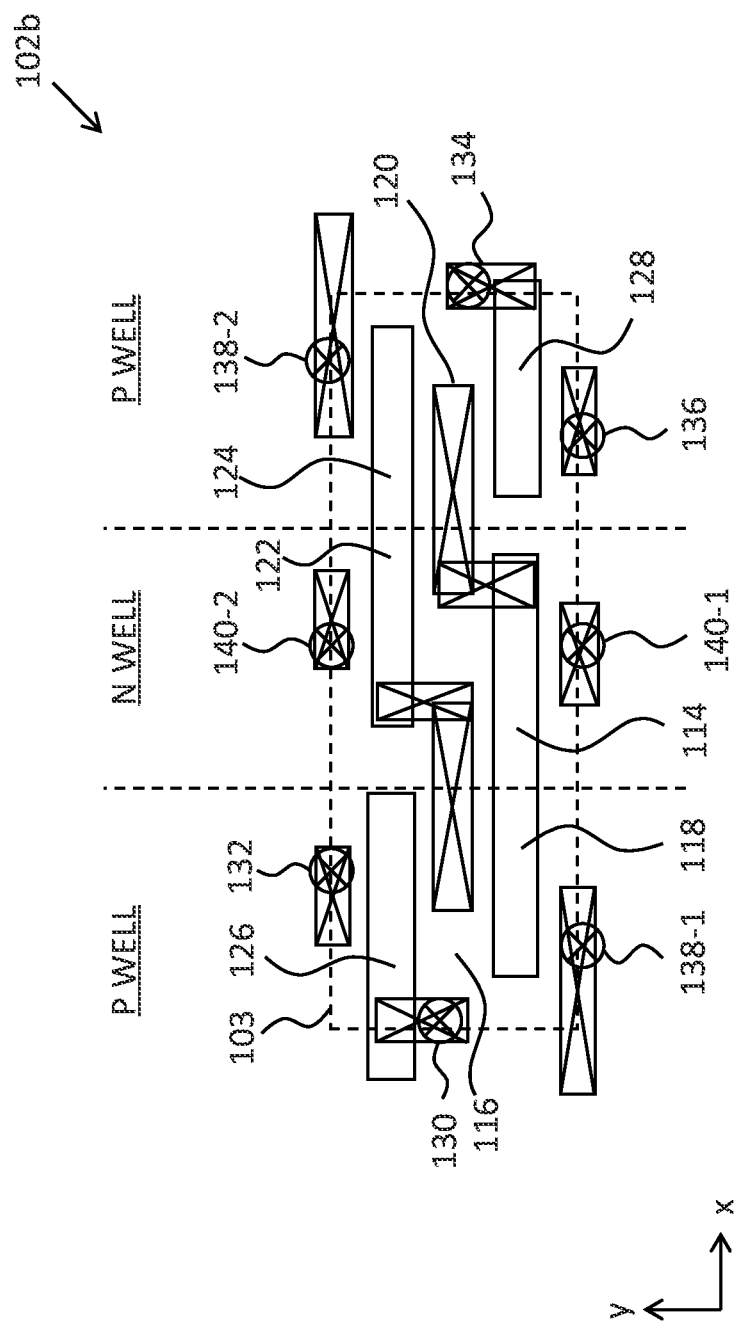
FIG. 6 illustrates another example of a FEOL layout of a single-port semiconductor bit cell configured for high-speed applications.

FIG. 6 illustrates an embodiment of a FEOL layout of a single-port bit cell 102b configured for high-current, e.g., high-speed, applications. As described above, an array 100 may include both high density bit cells 102a and high-current bit cells 102b on the same integrated circuit chip. For high-current/speed applications, the layout of the bit cell 102b may be greater than the layout for high-density bit cells 102a, but with a same width or y-dimension. In some embodiments, the layout for high-current bit cells 102b are greater than an area for high-density bit cells 102a by ten percent. In some embodiments, the length-to-width ratio of high-current bit cells 102b are greater than or equal to 2.5. However, one skilled in the art will understand that the length-to-width ratio may be less than or greater than 2.5.

As shown in FIG. 6, bit cell 102b includes a cell boundary 103 having a length that extends in the x-direction with a dimension that is greater than the dimension of the width, which extends in the y-direction. Bit cell 102b includes a pair of p-wells that are disposed on either side of an n-well. Pull-down transistor 118 and pass transistor 126 are formed in one p-well, and pull down transistor 124 and pass transistor 128 are formed in the other p-well. Pull up transistors 114 and 122 are formed in the n-well.

A first via layer, e.g., VIA0, is used connect devices formed in doped regions 101a of semiconductor substrate 101 to conductive routing lines formed in conductive layers, e.g., M1-M3, which are formed during back end of line (BEOL) processing. For example, node 130, which couples the gate of pass transistor 130 to the WL, is formed in VIA0 as is node 132, which couples pass transistor 126 to bit line BL. Node 134, which couples pass gate transistor 128 to the WL is formed in VIA0 as is node 136, which couples pass transistor 128 to bit line BLB. VIA0 also includes nodes 138-1 and 138-2, which respectively couple pull down transistors 118 and 124 to VSS, and nodes 140-1 and 140-2, which respectively couple pull down transistor 114 and 124 to VDD.

Vias 132, 138-2, and 140-2 are aligned with each other in the x-direction and are disposed along a topmost boundary of cell boundary 103, and vias 138-1, 136, and 140-1 are aligned with one another in the x-direction and are disposed along the bottommost edge of cell boundary 103. Via 130 is disposed along the leftmost edge of cell boundary 103, but is not aligned with via 138-1 in the y-direction. Via 134 is disposed along the rightmost edge of cell boundary 103, but is not aligned with via 136 in the y-direction.

Figure 7A:
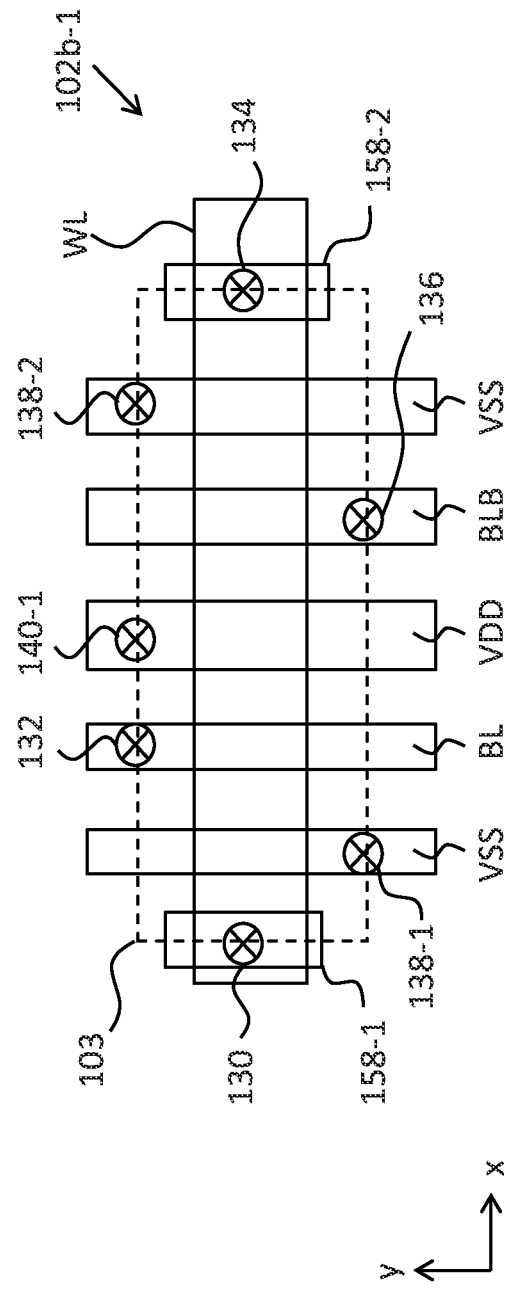
FIGS. 7A-7C illustrate various embodiments of BEOL layouts for the single-port memory bit cell illustrated in FIG. 6.

FIG. 7A illustrates one example of a BEOL layout of conductive layers M1 and M2 of a single-port bit cell 102b-1 configured for high-current/speed, applications in accordance with the FEOL layout illustrated in FIG. 6. The first conductive layer, M1, includes each of the lines that extend in the y-direction across bit cell 102. For example, islands 158-1 and 158-2, power supply lines VSS and VDD, and bit lines BL and BLB are each formed in the first conductive layer, M1. The WL, which extends in the x-direction such that it is disposed perpendicular to the lines formed in the first conductive layer, is formed in the second conductive layer, M2. Island 144-1 serves as a landing area for node 130, which is also formed in VIA1 and couples the gate of pass transistor 126 to the WL. Island 158-2 serves as a landing area for node 134, which is also disposed in VIA1 and couples the gate of pass transistor 128 to the WL.

The couplings between the doped area 101a of semiconductor substrate 101 and the first conductive layer, M1, include nodes 132, 136, 138-1, 138-2, and 140-1, which are formed in VIA0. As described above with reference to FIG. 6, node 132 couples transistor 126 to bit line BL, and node 136 couples transistor 128 to bit line BLB. Nodes 138-1 and 138-2 respectively couple transistors pull down transistors 118 and 114 to low voltage power supply VSS. Node 140-1 couples pull up transistor 114 to high voltage power supply VDD. Via 130

Locating bit lines BL and BLB on the first conductive layer, M1, reduces the coupling capacitance of the high-current, e.g., high-speed, bit cell as fewer islands are used for BEOL connections. Additionally, locating the WL on the second conductive layer enables the width of the WL to be increased, which enables a reduction in the resistance of the WL.

Figure 7B:
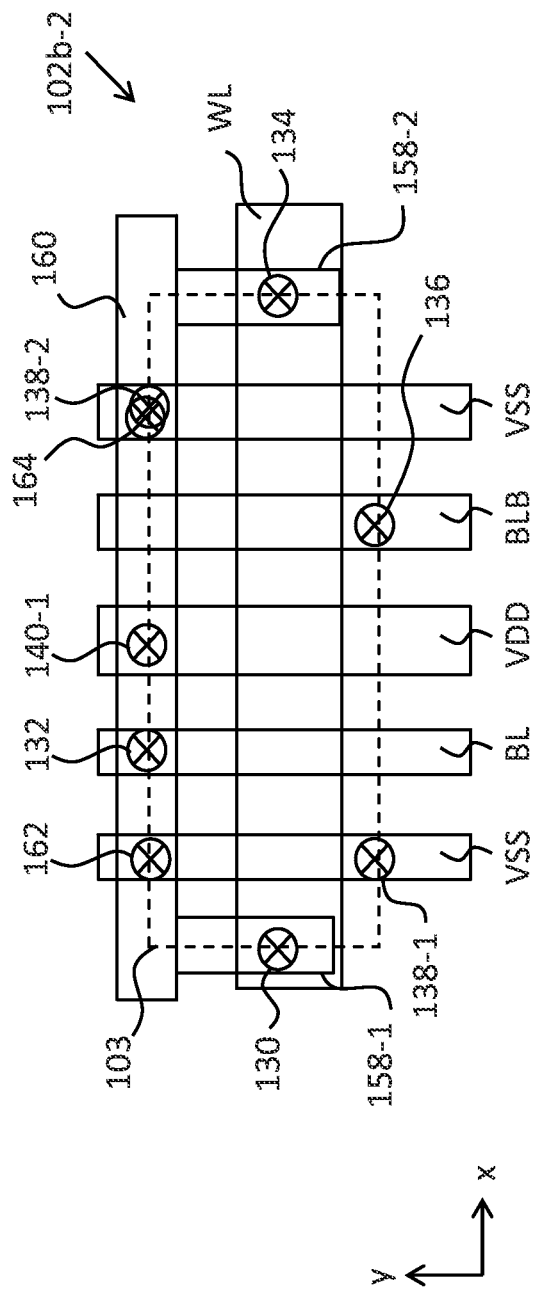

In some embodiments, such as the embodiment of a high-current bit cell 102b-2 illustrated in FIG. 7B, the second conductive layer, M2, may include a power mesh line 160 that is coupled to the VSS lines in the first conductive layer, M1. Power line 160 extends parallel to the WL in the same conductive layer and is coupled to the VSS lines by vias 162 and 164, which are formed in VIA1.

Figure 7C:
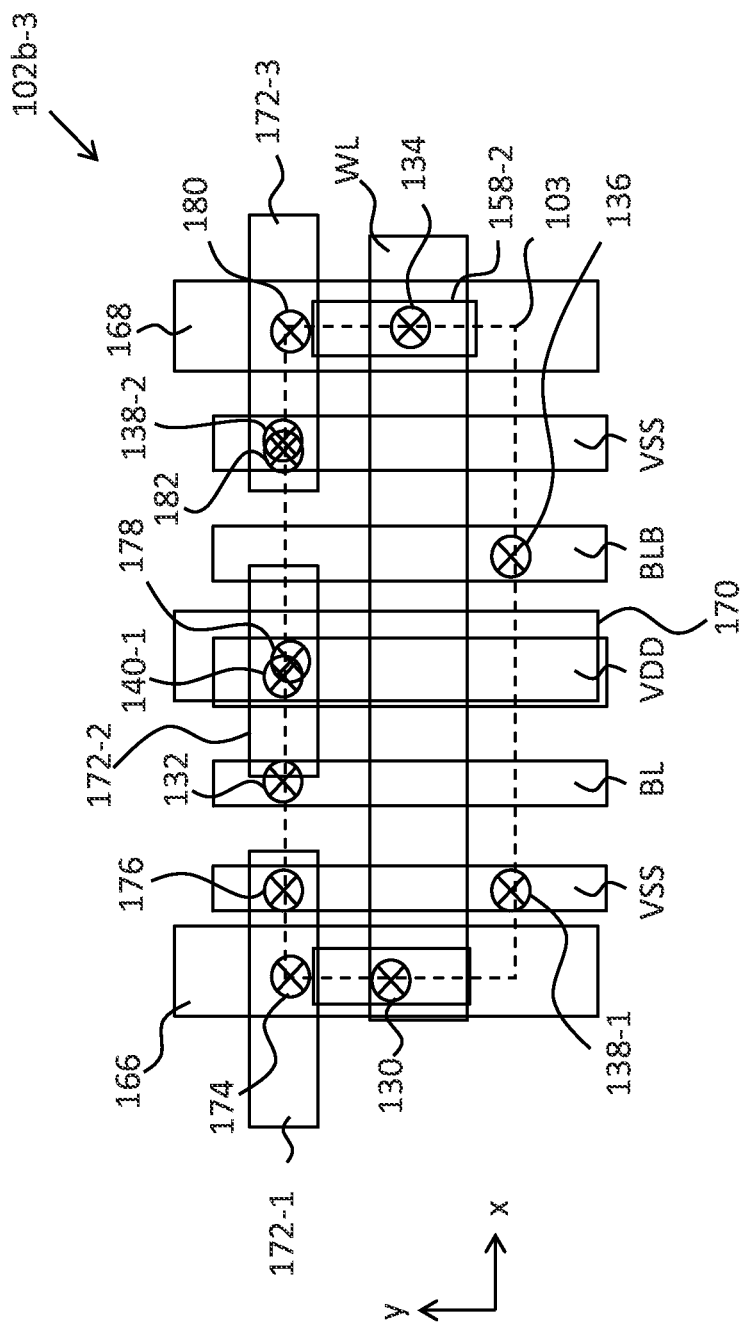

In some embodiments, such as the embodiment of a high-speed bit cell 102b-3 illustrated in FIG. 7C, a third conductive layer, M3, may include low voltage power supply lines 166 and 168 and a high voltage power supply line 170. Power supply lines 166, 168, and 170 extend in the y-direction across bit cell 102b-3 such that they are parallel to the power supply lines VSS and VDD and bit lines BL and BLB, which are disposed in the first conductive layer.

Line 166 in the third conductive layer is coupled to a landing strip 172-1, which is disposed in the second conductive layer, M2, by via 174 that is disposed in VIA2. Landing strip 172-1 is also coupled to via 176, which is formed in VIA1 and couples landing strip 172-1 to the VSS line disposed in the first conductive layer. A second landing strip 172-2 is formed in the second conductive layer, M2, such that landing strip is collinear with landing strip 172-1 and parallel to the WL. Landing strip 172-2 is coupled to line 170 by via 178 formed in VIA2 and to the VDD supply disposed in the first conductive layer, M1, by via 140-1, which is disposed in VIA1. A third landing strip 172-3 is disposed in the second conductive layer such that it is collinear with the first and second landing strips 172-1 and 172-2. Landing strip 172-3 is coupled to power supply line 168 by via 180 and to the power supply line VSS by via 182.

Figure 8:
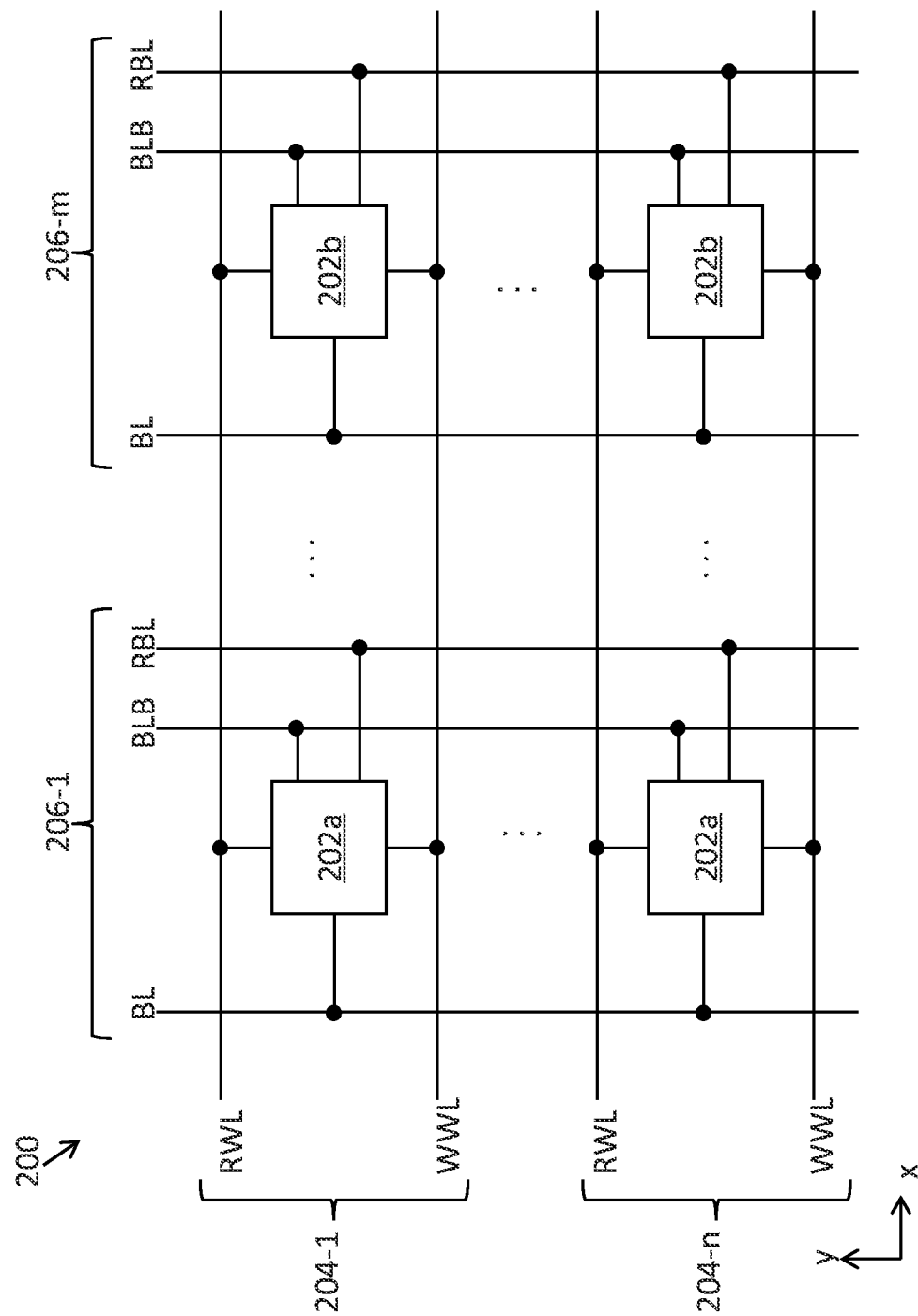
FIG. 8 illustrates one example of a semiconductor memory comprising a plurality of two-port bit cells arranged in rows and columns.

The improved routing layouts described of above with respect to single-port bit cells may be utilized in two-port configurations. FIG. 8 illustrates one example of a two-port SRAM array 200 including a plurality of two-port bit cells 202a, 202b (collectively referred to as "bit cells 202"). Bit cells 102 are arranged in a number, n, of rows 204 and a number, m, of columns 206. Each bit cell 202a, 202b is coupled to a write word line, WWL, that extends horizontally across the memory array (i.e., in an x-direction), to a pair of complementary write bit lines, WBL and WBLB, and to a read bit line, RBL. Bit lines BL, BLB, and RBL extend vertically across the memory array (i.e., in a y-direction). Semiconductor array 200 may include an array of high-density bit cells 202a and high-current/speed bit cells 202b.

As illustrated in FIG. 8, which is one example of a two-port eight-transistor ("8T") bit cell 202, each bit cell 202 includes a latch 208 formed by a pair of cross coupled inverters 210, 212. Inverter 210 includes a PMOS transistor 214 having its source coupled to high-voltage source, VDD, and its drain coupled to node 216, which serves as the output of inverter 210. NMOS transistor 218 of inverter 210 has its source coupled to low-voltage source VSS and its drain coupled to node 216. The gates of transistors 214 and 218 are coupled together at node 220, which serves as the input of inverter 210 and the output of inverter 212. Inverter 212 includes a PMOS transistor 222 having is source coupled to VDD, its gate coupled to node 216, and its drain coupled to node 220. NMOS transistor 224 of inverter 212 has its source coupled to VSS, its drain coupled to node 220, and its gate coupled to node 216.

A read pull-down transistor 238 has its gate coupled to node 220 and is coupled to low voltage power supply VSS and to read pass transistor 240. Pass transistor is coupled to RBL at node 242 and has its gate coupled to RWL at node 244. In some embodiments, transistors 238 and 240 are NMOS transistors.

The transistors of bit cell 202 may be formed in one or more active regions of a semiconductor substrate using various technologies. For example, the transistors of the bit cell may be formed as bulk planar metal oxide field effect transistors ("MOSFETs"), bulk finFETs having one or more fins or fingers, semiconductor on insulator ("SOI") planar MOSFETs, SOI finFETs having one or more fins or fingers, or combinations thereof. The gates of the devices may include a polysilicon ("poly")/silicon oxynitride ("SiON") structure, a high-k/metal gate structure, or combinations thereof. Examples of the semiconductor substrate include, but are not limited to, bulk silicon, silicon-phosphorus ("SiP"), silicon-germanium ("SiGe"), silicon-carbide ("SiC"), germanium ("Ge"), silicon-on-insulator silicon ("SOI-Si"), silicon-on-insulator germanium ("SOI-Ge"), or combinations thereof.

Figure 9:
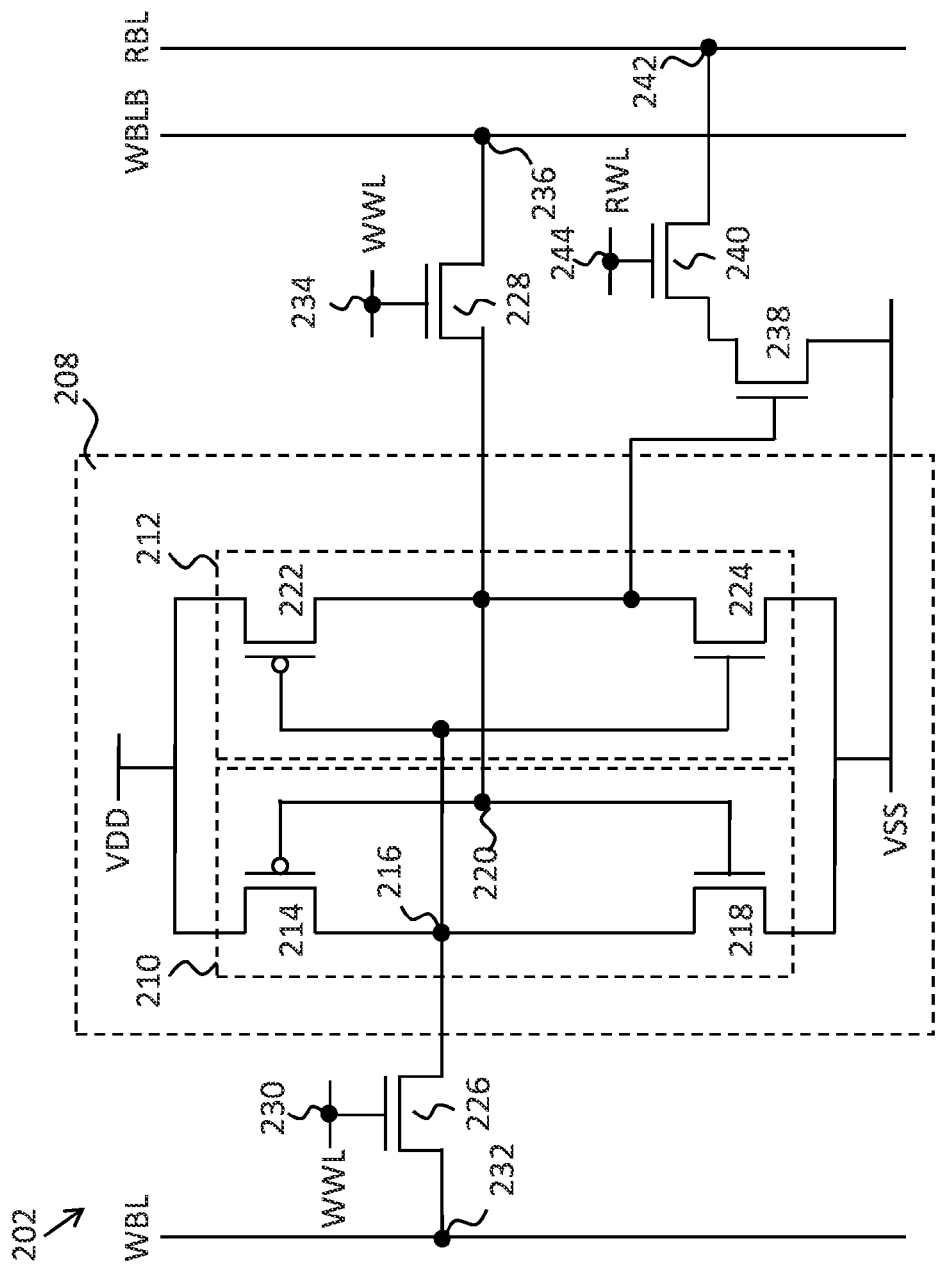
FIG. 9 illustrates one example of a two-port memory bit cell that may be implemented in the semiconductor memory of FIG. 8.
Figure 10:
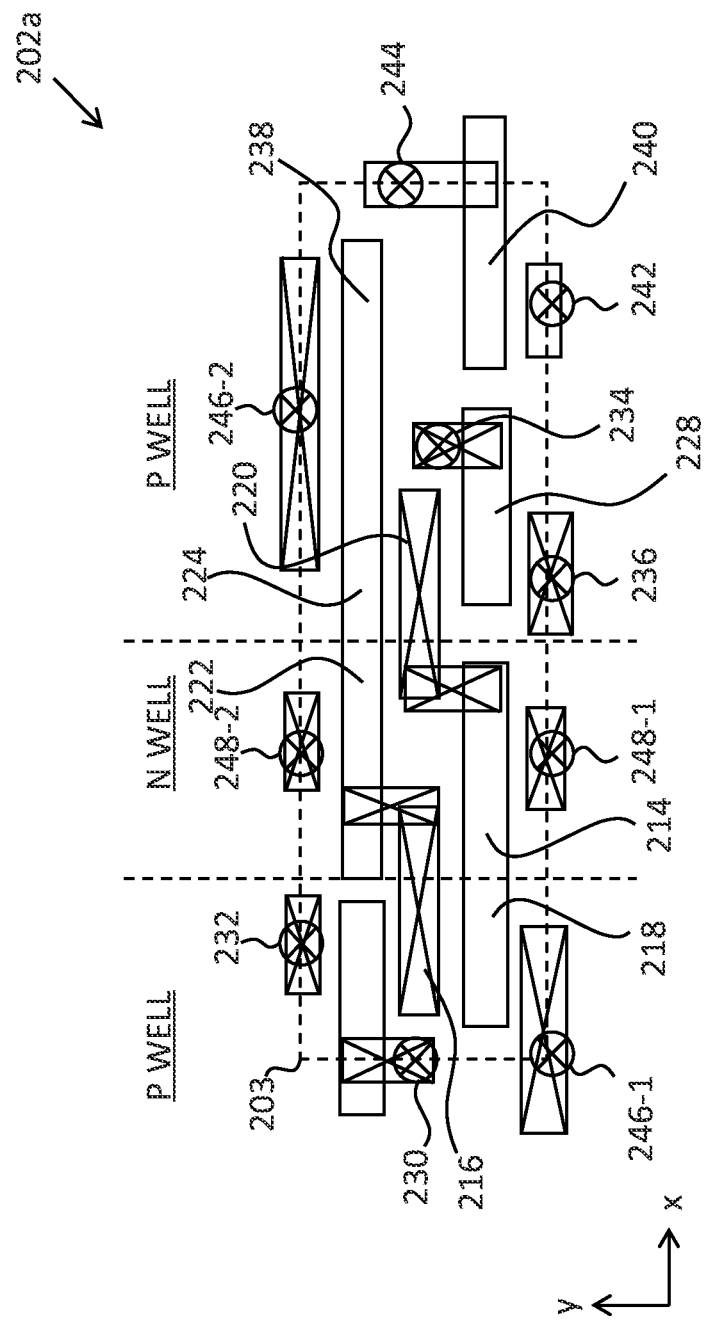
FIG. 10 illustrates one example of a FEOL layout of a two-port semiconductor memory bit cell configured for high-density applications.

FIG. 10 illustrates one example of a FEOL layout of a high-density two-port transistor 202a in accordance with the bit cell 202 illustrated in FIG. 9. Bit cell 202a includes a cell boundary 203 having a length that extends in the x-direction that is greater than a width, which extends in the y-direction. Bit cell 202a includes a pair of p-wells that are separated by a n-well. Pull-down transistor 218 and pass transistor 226 are formed in one p-well, and pull down transistor 224 and pass transistor 228 are formed in the other p-well. Pull up transistors 214 and 222 are formed in the n-well. Read pull-down transistor 238 and read pass transistor 240 are also formed in a p-well.

As described above with respect to FIG. 3, the doped region 101a of semiconductor substrate 101 is coupled to a first conductive layer, M1, which is formed over semiconductor substrate 101, by vias formed a VIA0 layer. As will be understood by an ordinarily skilled person in the art, multiple conductive layers, e.g., M1-M3, may be formed over semiconductor substrate 101. The conductive layers M1-M3 may be separated from one another by dielectric layers (not shown).

The vias formed in the VIA0 layer include via 230, which couples pass transistor 226 to the WWL that is disposed in the first conductive layer, M1. Via 230 is disposed along a leftmost edge of cell boundary 203 and is aligned in the y-direction with via 246-1 that couples pull-down transistor 218 to VSS. Via 246-1 is disposed along a bottommost edge of cell boundary 203 and is aligned in the x-direction with vias 248-1, 236, and 242. Via 248-1 couples pull-up transistor 214 to high voltage supply line VDD, and via 236 couples transistor 228 to bit line WBLB. Via 242 couples read pass transistor 240 to bit line RBL. Read pass transistor 240 has its gate coupled to RWL by via 244, which is disposed at the rightmost edge of cell boundary 203.

Along the uppermost edge of cell boundary 203 vias 232, 248-2, and 246-2 are disposed. Via 232 couples pass transistor 226 to bit line WBL, and via 248-2 couples pull-up transistor 222 to high voltage supply line VDD. Via 246-2 couples pull-down transistor 224 to low voltage supply line VSS. A via 234, which is not disposed along an edge of cell boundary 203, couples pass transistor 228 to WWL.

Figure 11A:
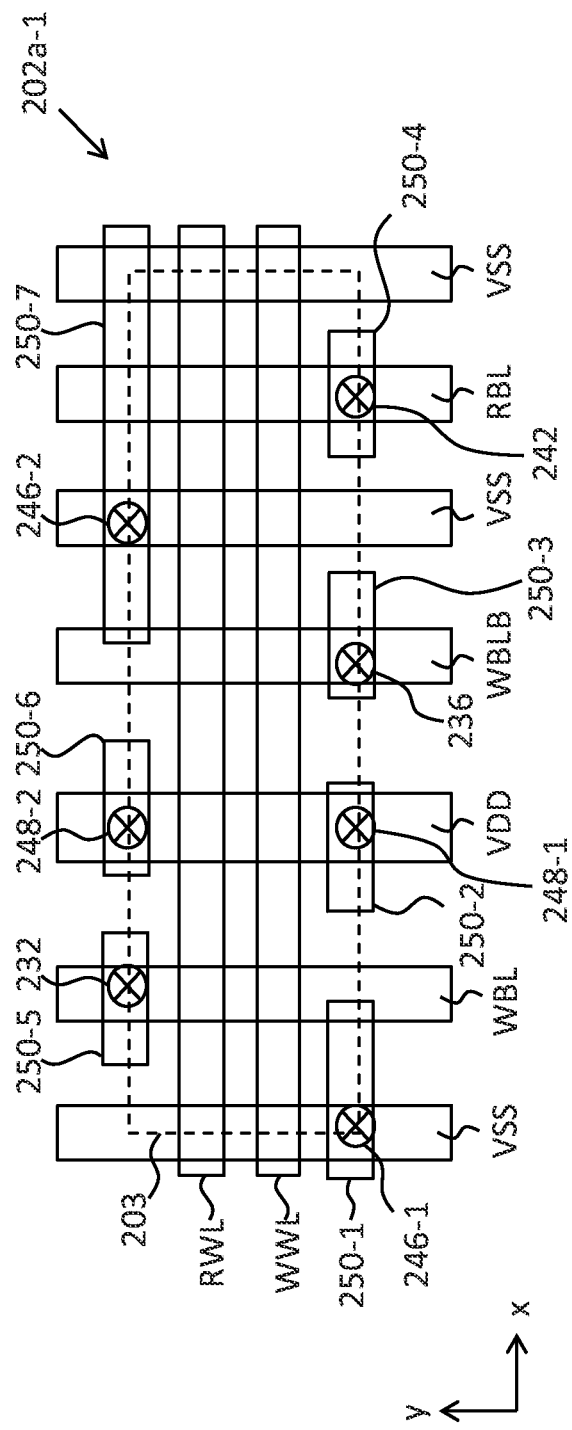
FIGS. 11A-11B illustrate various embodiments of BEOL layouts for the two-port memory bit cell illustrated in FIG. 10.

One example of a BEOL layout of a two-port high-density bit cell 202a-1 is illustrated in FIG. 11A. As shown in FIG. 11A, read and write word lines, RWL and WWL, extend parallel to one another in an x-direction across cell 202a-1 and are formed in a first conductive layer, M1. A plurality of landing pads 250-1, 250-2, 250-3, 250-4, 250-5, 250-6, and 250-7 ("landing pads 250") are also formed in the first conductive layer, M1, and extend parallel to word lines RWL and WWL. Landing pads 250-1, 250-2, 250-3, and 250-4 are collinearly formed and are disposed along the bottom edge of cell boundary 203, and landing pads 250-5, 250-6, and 250-7 are collinear with one another and are disposed along the upper edge of cell boundary 203.

Landing pad 250-1 provides for the portion of via 246-1 that is disposed in VIA0 to be coupled to the portion of via 246-1 that is disposed in VIA1 such that transistor 218, which is formed in doped region 101a, is coupled to a VSS line, which is disposed in the second conductive layer, M2. Landing pad 250-2 provides for coupling between the portion of via 248-1 disposed in VIA0 and the portion of via 248-1 that is disposed in VIA1. Landing pad 250-3 couples the portion of via 236 that is disposed in VIA0 and is directly coupled to transistor 228 formed in substrate 101 to the portion of via 236 that is disposed in VIA1 and is directly coupled to bit line BLB.

Landing pad 250-4 couples together the portion of via 242 that is disposed in VIA0, which is directly coupled to transistor 240 formed in substrate 101, and the portion of via 242 that is disposed in VIA, which is directly coupled to bit line RBL in the second conductive layer M2. The portions of via 232 disposed in VIA0 and VIA1 are coupled together by landing pad 250-5. Landing pad 250-6 couples together the portion of via 248-2 disposed in VIA0 and the portion of via 248-2 disposed in VIA1. Landing pad 250-7 has a length that is greater than the lengths of the other landing pads 250. In some embodiments, landing pad 250-7 extends from one bit cell to an adjacent bit cell (not shown). Landing pad 250-7 couples together the portion of via 246-2 disposed in VIA0, which is directly coupled to transistor 224 formed in semiconductor substrate 101, and the portion of via 246-2 disposed in VIA1, which is directly coupled to VSS disposed in the second conductive layer M2.

Figure 11B:
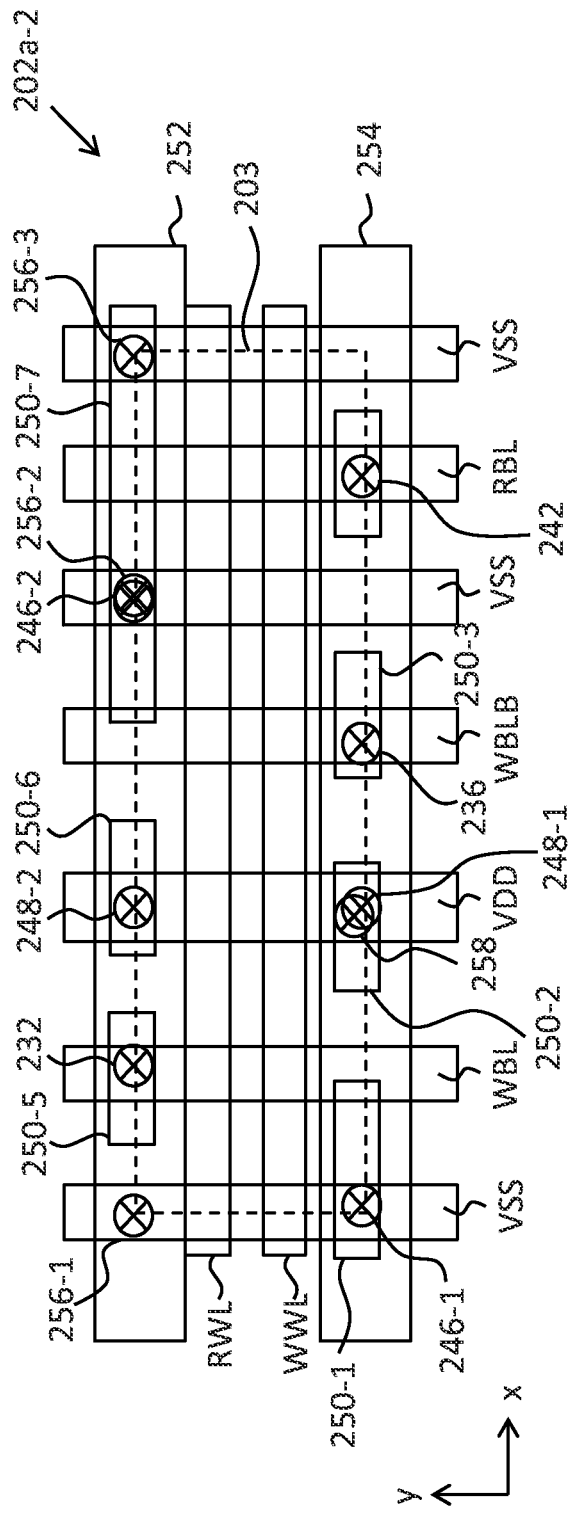

In some embodiments, such as the embodiment of high-density bit cell 202a-2 illustrated in FIG. 11B, power mesh lines 252, 254 are disposed in a third conductive layer, M3, and extend in the x-direction such that lines 252, 254 are parallel to word lines RWL and WWL. As shown in FIG. 11B, power mesh line 252 is disposed above and at least partially overlaps the upper edge of cell boundary 203 and landing pads 250-5, 250-6, and 250-7. Power mesh line 254 is coupled to the VSS lines disposed on the second conductive layer, M2, by vias 256-1, 256-2, and 256-3, which are formed in the VIA2 layer.

Power mesh line 254 is disposed above and at least partially overlaps the lower edge of cell boundary 203 and landing pads 250-1, 250-2, 250-3, and 250-4. Power mesh line 254 is coupled to the VDD line disposed on the second conductive layer, M2, by vias 258, which is formed in the VIA2 layer.

Figure 12:
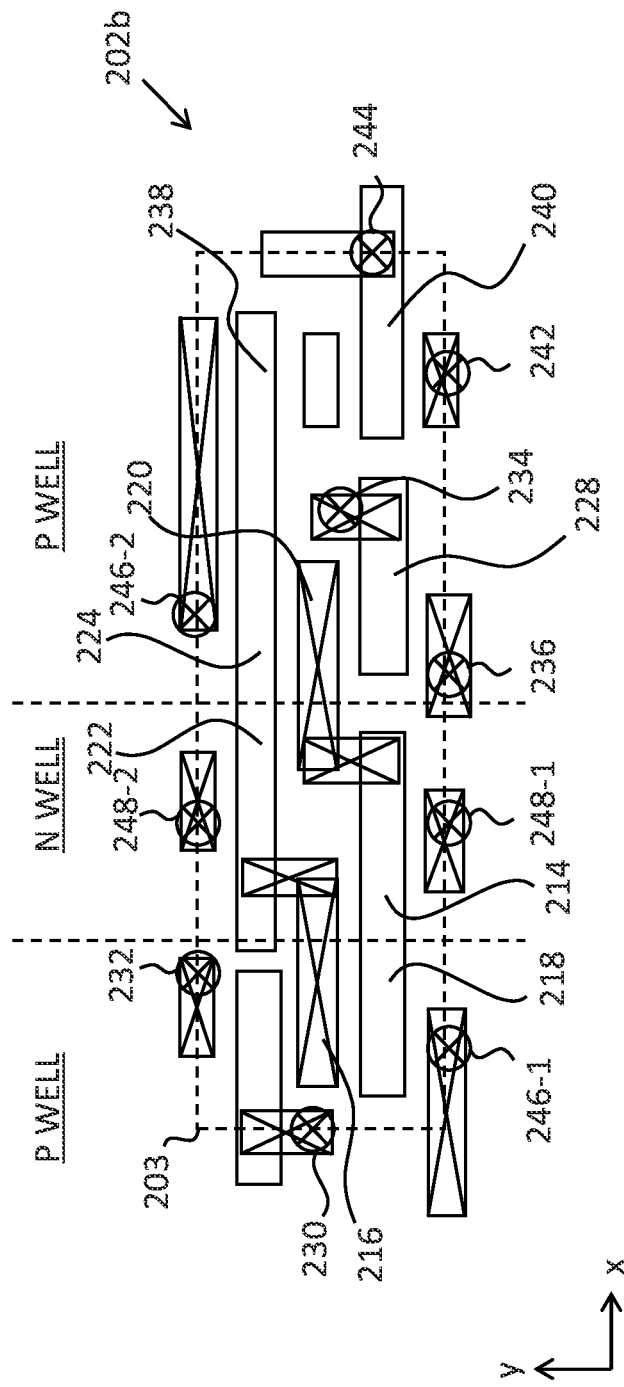
FIG. 12 illustrates another example of a FEOL layout of a two-port semiconductor memory bit cell configured for high-speed application.

FIG. 12 illustrates one example of a FEOL layout of a high-speed two-port transistor 202b in accordance with the bit cell 202 illustrated in FIG. 9. Bit cell 202b has a cell boundary 203 having a length extending in the x-direction and a width extending in the y-direction. A pair of p-wells are separated by an n-well of the doped area 101a of semiconductor substrate 101.

Pull-down transistor 218 and pass transistor 226 are formed in one p-well, and pull down transistor 224 and pass transistor 228 are formed in the other p-well. Pull up transistors 214 and 222 are formed in the n-well. Read pull-down transistor 238 and read pass transistor 240 are also formed in a p-well.

Via 230 is disposed in the VIA0 layer couples word line WWL formed in a conductive layer over semiconductor substrate 101 to a gate contact of transistor 226. As shown in FIG. 12, via 230 is disposed along the leftmost edge of cell boundary 203. Via 232 is formed in the VIA0 layer along an uppermost edge of cell boundary 203 and couples bit line WBL to a contact coupled to transistor 226. Via 246-1, which is disposed along a bottommost edge of cell boundary 203, and is not vertically aligned with via 230. Via 246-1 is formed in the VIA0 layer and couples together VSS to a contact coupled to pull-down transistor 218.

Via 248-1 is formed over the n-well such that it is horizontally aligned with via 246-1 along the bottom edge of cell boundary 203. Via 248-1 couples VDD to a contact for pull-down transistor 214. Pull-up transistor 222 is coupled to VDD by via 248-2, which is aligned in the y-direction with via

248-1. Via 246-2 is aligned with vias 232 and 248-2 in the x-direction and couples pull-down transistor 224 to VSS.

Vias 236 and 242 are in the VIA0 layer over a p-well such that they are aligned with vias 246-1 and 248-1 along with the bottom of cell boundary 203. Via 236 couples a contact of transistor 228 to bit line WBLB, and via 242 couples transistor 240 to bit line RBL. Via 234 couples a gate contact of transistor 229 to word line WWL. Via 244 is disposed along the right edge of cell boundary 203 and couples the gate contact of transistor 240 to word line RWL.

Figure 13:
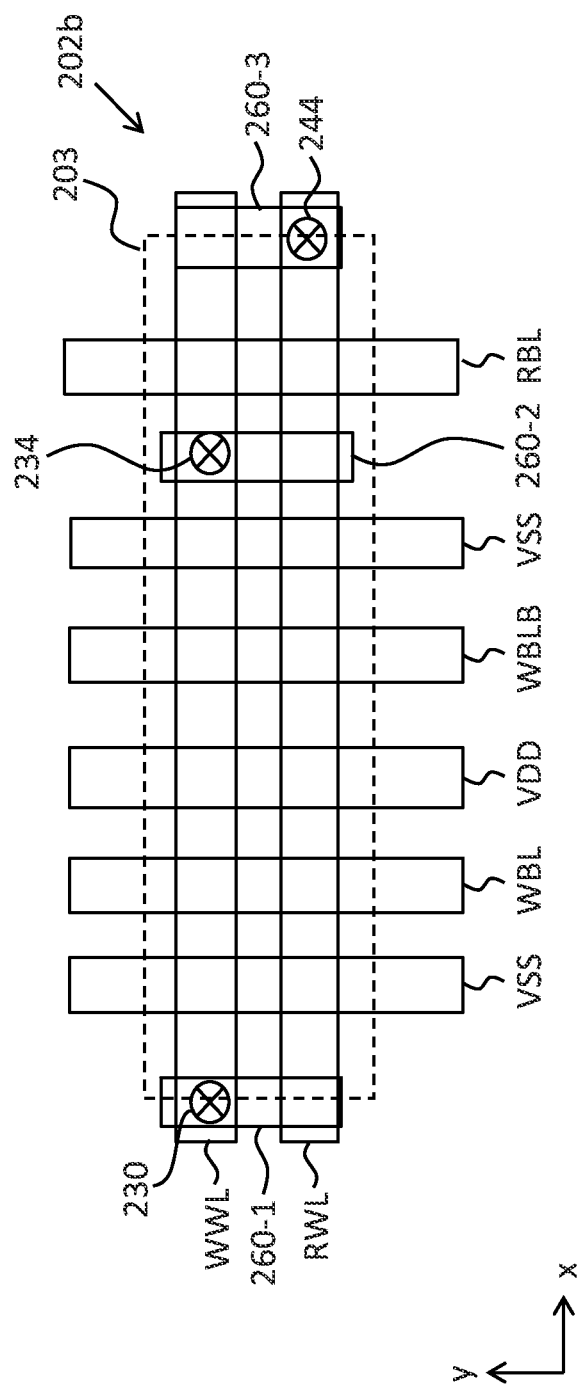
FIG. 13 illustrates one example of a BEOL layout for the two-port semiconductor memory bit cell illustrated in FIG. 12.

One example of a BEOL layout of a bit cell 202*b* is illustrated in FIG. 13. The power supply lines for VSS and VDD and bit lines WBL, WBLB, and RBL, extend across the bit cell illustrated in FIG. 13 in the y-direction and are disposed on the first conductive layer, M1. Word lines WWL and RWL extend across the bit cell in the x-direction in the second conductive layer, M2. Landing pads 260-1, 260-2, and 260-3 ("landing pads 260") are disposed on the first conductive layer, M1, and extend parallel to the power supply for VSS and VDD and bit lines WBL, WBLB, and RBL.

Landing pad 260-1, which extends along the leftmost edge of cell boundary 203, is used to couple a portion of via 230 disposed in the VIA0 layer to a portion of via 230 formed in the VIA1 layer. As described above, via 230 couples a gate contact of transistor 230 to word line WWL. Landing pad 260-2 is disposed between the power supply line for VSS and bit line RBL and couples a portion of via 234 in VIA0 to a portion of via 234 in VIA1. Via 234 couples the word line WWL disposed in the second conductive layer, M2, to a gate contact of transistor 228. Landing page 260-3 extends along the right edge of cell boundary 203 and couples a portion of via 244 formed in VIA0 to a portion of via 244 formed in VIA1 such that a gate contact of transistor 240 is couples to word line RWL.

Figure 14A:
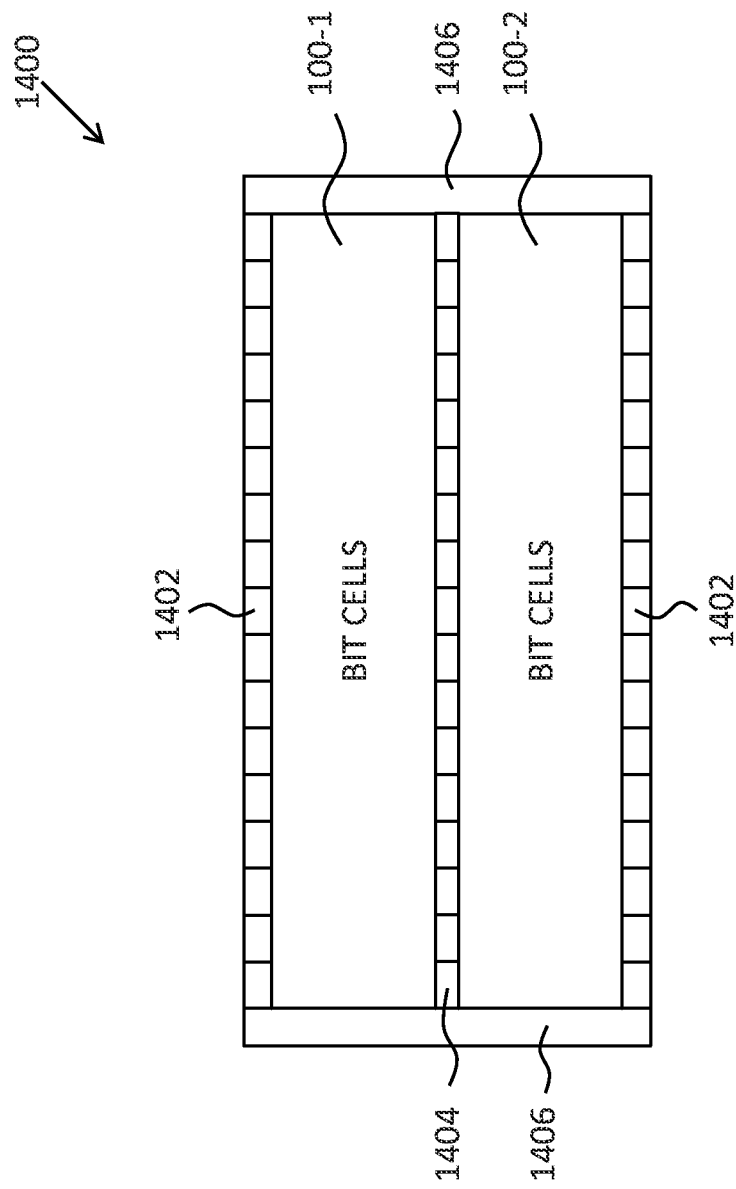
FIG. 14A illustrates one example of a semiconductor memory including an array of bit cells and various strapping cells.

The arrays in which the memory bit cells described above are included may also include strapping cells to produce an array having consistent operating characteristics as described in U.S. Pat. No. 7,812,407 issued to Liaw, the entirety of which is herein incorporated by reference. FIG. 14A illustrates one example of a semiconductor memory 1400 including arrays 100-1, 100-2 of bit cells including a plurality of edge strapping cells 1402, well strapping cells 1404, and dummy edge cells 1406.

Figure 14B:
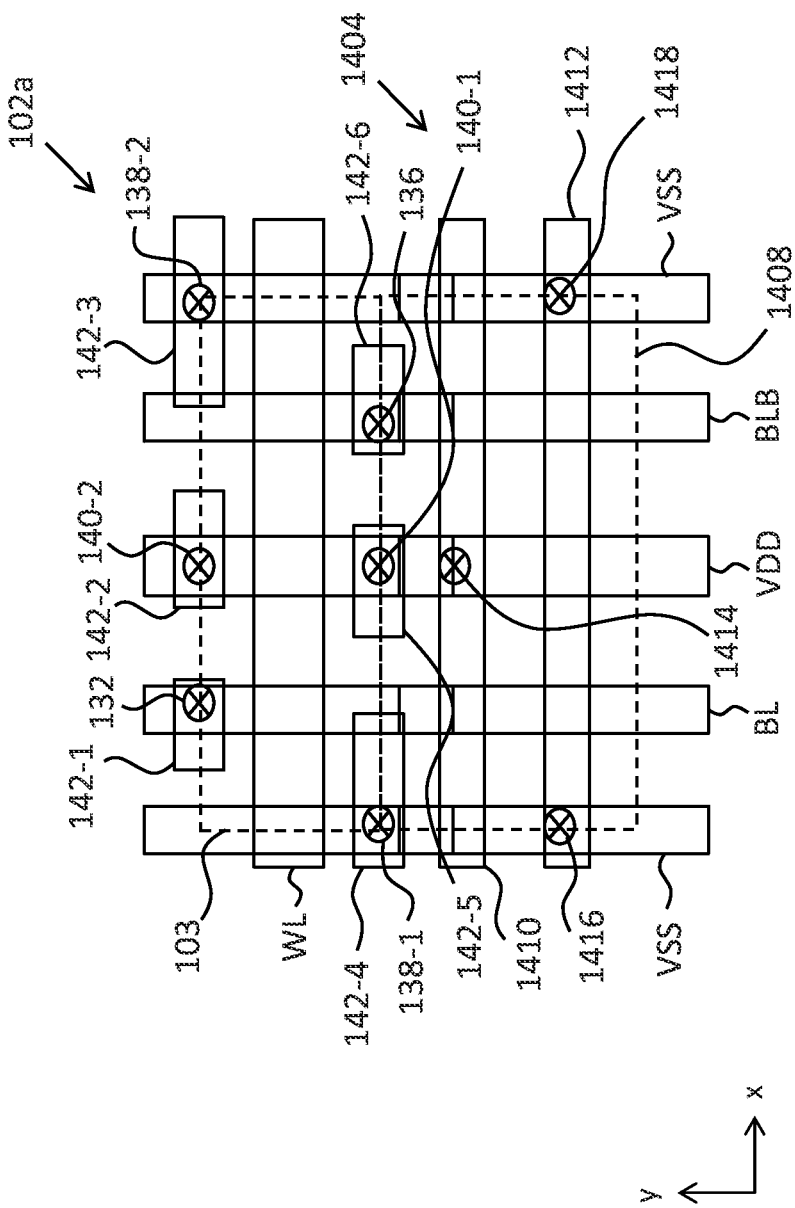
FIG. 14B illustrates one example of a semiconductor bit cell in accordance with FIG. 5A coupled to a well strapping cell in accordance with FIG. 14A.

FIG. 14B illustrates one example of a BEOL layout of a bit cell 102*a* in accordance with FIG. 5A coupled to a BEOL layout of a well strapping cell 1404. Well strapping cell 1404 has a boundary 1408. Bit cells BL and BLB extend from bit cell 102*a* across well strapping cell 1404 in the second conductive layer M2. Power supply lines for VSS and VDD are also formed in the second conductive layer M2 and extend parallel to bit lines BL and BLB.

In the first conductive layer, M1, an n-well strapping line 1410 and p-well strapping line 1412 extend in the x-direction across strapping cell 1404. N-well strapping line 1410 is coupled to the VDD power supply disposed in the second conductive layer by a via 1414 formed in the VIA1 layer, which extends between the first and second conductive layers. The P-well strapping line 1412 is coupled to the power supply lines for VSS disposed in the second conductive layer, M2, by a pair of vias 1416 and 1418 formed in the VIA1 layer.

The semiconductor layouts disclosed above advantageously include two different metal routing schemes that may be implemented on a single chip. Implementing two different metal routing layouts enables the optimization of cell structures for high-density and/or high-current applications on a single chip. In some embodiments, the two or more cell layouts are of differing sizes and provide for litho-friendly routing.

In some embodiments, a semiconductor memory includes a first bit cell within an integrated circuit (IC), and a second bit cell within the same IC. The first bit cell has a first layout, and the second bit cell has a second layout that differs from the first layout.

In some embodiments, an integrated circuit chip includes a first plurality of memory bit cells formed in a semiconductor substrate. Each of the first plurality of memory bit cells has a first layout. A second plurality of memory bit cells is formed in the semiconductor substrate. Each of the second plurality of memory bit cells has a second layout that differs from the first layout.

In some embodiments, an integrated circuit chip includes a first plurality of memory bit cells formed in a semiconductor substrate. Each of the first plurality of memory bit cells has a first layout. The first layout includes a first word line disposed in a first conductive layer and extends in a first direction and a plurality of bit lines disposed in a second conductive layer that extend in a second direction. A second plurality of memory bit cells is formed in the semiconductor substrate. A size of the second plurality of bit cells is different than a size of the first plurality of bit cells. Each of the second plurality of memory bit cells has a second layout. The second layout includes a second word line disposed in the second conductive layer and that extends in the first direction and a plurality of bit lines disposed in the first conductive layer and that extend in the second direction.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor memory, comprising:
   a first bit cell of a first memory type within an integrated circuit (IC), the first bit cell of the first memory type having a first layout, the first layout including
      a first word line disposed in a first conductive layer and extending in a first direction, and, and
      a plurality of bit lines disposed in a second conductive layer and extending in a second direction; and
   a second bit cell of the first memory type within the same IC as the first bit cell, the second bit cell of the first memory type having second layout, the second layout including
      a second word line disposed in the second conductive layer and extending in the first direction, and
      a plurality of bit lines disposed in the first conductive layer and extending in the second direction,
   wherein the first layout differs from the second layout in that a size of the first layout is different from a size of the second layout.

2. An integrated circuit chip, comprising:
   a first plurality of memory bit cells of a first memory type formed in a semiconductor substrate, each of the first plurality of memory bit cells having a first layout having a first size and including
      a first word line disposed in a first conductive layer and extending in a first direction, and
      a plurality of bit lines disposed in a second conductive layer and extending in a second direction; and
   a second plurality of memory bit cells of the first memory type formed in the semiconductor substrate, each of the second plurality of memory bit cells having a second layout having a second size and including,
a second word line disposed in the second conductive layer and extending in the first direction, and
a plurality of bit lines disposed in the first conductive layer and extending in the second direction,
wherein the first layout differs from the second layout, and the first size differs from the second size.

3. The integrated circuit chip of claim 2, wherein the first layout includes at least one landing pad disposed in the first conductive layer and extending in the first direction, and the second layout includes at least one landing pad disposed in the first conductive layer and extending the second direction.

4. The integrated circuit chip of claim 3, wherein the first layout includes a first power mesh line disposed in a third conductive layer and extending in the first direction, the power mesh line being coupled to at least one power supply line disposed in the second conductive layer.

5. The integrated circuit chip of claim 4, wherein the second layout includes a second power mesh line disposed in the third conductive layer and extending in the second direction, the second power mesh line coupled to at least one power supply line disposed in the second conductive layer.

6. The integrated circuit chip of claim 2, wherein the first layout includes a first power supply line disposed in the second conductive layer and extending parallel to the plurality of bit lines, the first power supply line having a first voltage.

7. The integrated circuit chip of claim 6, wherein the second layout includes a second power supply line disposed in the first conductive layer and extending parallel to the plurality of bit lines, the second power supply line having the first voltage.

8. An integrated circuit chip, comprising:
a first plurality of memory bit cells formed in a semiconductor substrate, each of the first plurality of memory bit cells having a first layout that includes
a first word line disposed in a first conductive layer and extending in a first direction, and
a plurality of bit lines disposed in a second conductive layer and extending in a second direction; and
a second plurality of memory bit cells formed in the semiconductor substrate, a size of the second plurality of bit cells being different than a size of the first plurality of bit cells, each of the second plurality of memory bit cells having a second layout that includes
a second word line disposed in the second conductive layer and extending in the first direction, and
a plurality of bit lines disposed in the first conductive layer and extending in the second direction.

9. The integrated circuit chip of claim 8, wherein the first layout includes at least one landing pad disposed in the first conductive layer and extending in the first direction, and the second layout includes at least one landing pad disposed in the first conductive layer and extending the second direction.

10. The integrated circuit chip of claim 9, wherein the first layout includes a first power mesh line disposed in a third conductive layer and extending in the first direction, the power mesh line being coupled to at least one power supply line disposed in the second conductive layer.

11. The integrated circuit chip of claim 10, wherein the second layout includes a second power mesh line disposed in the third conductive layer and extending in the second direction, the second power mesh line coupled to at least one power supply line disposed in the second conductive layer.

12. A semiconductor memory, comprising:
a first bit cell within an integrated circuit (IC), the first bit cell having a first layout including
a first word line disposed in a first conductive layer and extending in a first direction, and
a plurality of bit lines disposed in a second conductive layer and extending in a second direction; and
a second bit cell within the same IC as the first bit cell, the second bit cell having second layout including
a second word line disposed in the second conductive layer and extending in the first direction, and
a plurality of bit lines disposed in the first conductive layer and extending in the second direction,
wherein the first layout differs from the second layout.

13. The semiconductor memory of claim 12, wherein the first layout includes at least one landing pad disposed in the first conductive layer and extending in the first direction, and the second layout includes at least one landing pad disposed in the first conductive layer and extending the second direction.

14. The semiconductor memory of claim 13, wherein the first and second bit cells are one of single-port bit cells or two-port bit cells.

15. The semiconductor memory of claim 13, wherein the first layout includes a first power mesh line disposed in a third conductive layer and extending in the first direction, the power mesh line being coupled to at least one power supply line disposed in the second conductive layer.

16. The semiconductor memory of claim 15, wherein the second layout includes a second power mesh line disposed in the third conductive layer and extending in the second direction, the second power mesh line coupled to at least one power supply line disposed in the second conductive layer.

17. The semiconductor memory of claim 12, wherein the first layout includes a first power supply line disposed in the second conductive layer and extending parallel to the plurality of bit lines, the first power supply line having a first voltage.

18. The semiconductor memory of claim 17, wherein the second layout includes a second power supply line disposed in the first conductive layer and extending parallel to the plurality of bit lines, the second power supply line having the first voltage.

19. The semiconductor memory of claim 12, wherein both cells are single-port bit cells.

20. The semiconductor memory of claim 19, wherein the second bit cell has a size that is greater than a size of the first bit cell.

* * * * *